United States Patent [19]

Anderson

[11] Patent Number: 5,194,131

[45] Date of Patent: Mar. 16, 1993

[54] APPARATUS AND METHOD FOR MULTIPLE RING SPUTTERING FROM A SINGLE TARGET

[75] Inventor: Robert L. Anderson, Palo Alto, Calif.

[73] Assignee: Varian Associates, Inc., Palo Alto, Calif.

[21] Appl. No.: 746,448

[22] Filed: Aug. 16, 1991

[51] Int. Cl.$^5$ .................................................. C23C 14/34
[52] U.S. Cl. ......................... 204/192.12; 204/298.18; 204/298.19; 204/298.2
[58] Field of Search .............. 204/192.12, 298.12, 204/298.18, 298.19, 298.2, 298.21, 298.22

[56] References Cited

U.S. PATENT DOCUMENTS

| | | | |
|---|---|---|---|
| 4,444,643 | 4/1984 | Garrett | 204/298 |
| 4,457,825 | 7/1984 | Lamont, Jr. | 204/298 |
| 4,466,877 | 8/1984 | McKelvey | 204/298 |
| 4,498,969 | 2/1985 | Ramachandran | 204/298.2 X |
| 4,606,806 | 8/1986 | Helmer | 204/298 |
| 4,622,121 | 11/1986 | Wegmann et al. | 204/298 |
| 4,714,536 | 12/1987 | Freeman et al. | 204/298.2 |
| 4,746,417 | 5/1988 | Ferenbach et al. | 204/298.2 |
| 4,872,964 | 10/1989 | Suzuki et al. | 204/298.2 |
| 4,995,958 | 2/1991 | Anderson et al. | 204/298.2 |
| 5,047,130 | 9/1991 | Akao et al. | 204/298.2 X |

FOREIGN PATENT DOCUMENTS

| | | | |
|---|---|---|---|
| 0100180 | 5/1988 | Japan | 204/298.2 |
| 0290275 | 11/1988 | Japan | 204/298.2 |
| 2004965 | 1/1990 | Japan | 204/298.22 |

*Primary Examiner*—Nam X. Nguyen

[57] ABSTRACT

A source for sputtering from concentric rings on the surface of a single target is shown. The source comprises a rotatable closed-loop magnet having a plurality of curved sections of different average radius interconnected by a equal number of radial sections. In the preferred embodiment the curved sections each have a shape which results in a predetermined erosion profile in the associated concentric ring of the sputter target. The relative rate of sputtering from each of the rings may be controlled by adjusting the relative lengths of the curved portions of the closed-loop magnet.

17 Claims, 4 Drawing Sheets

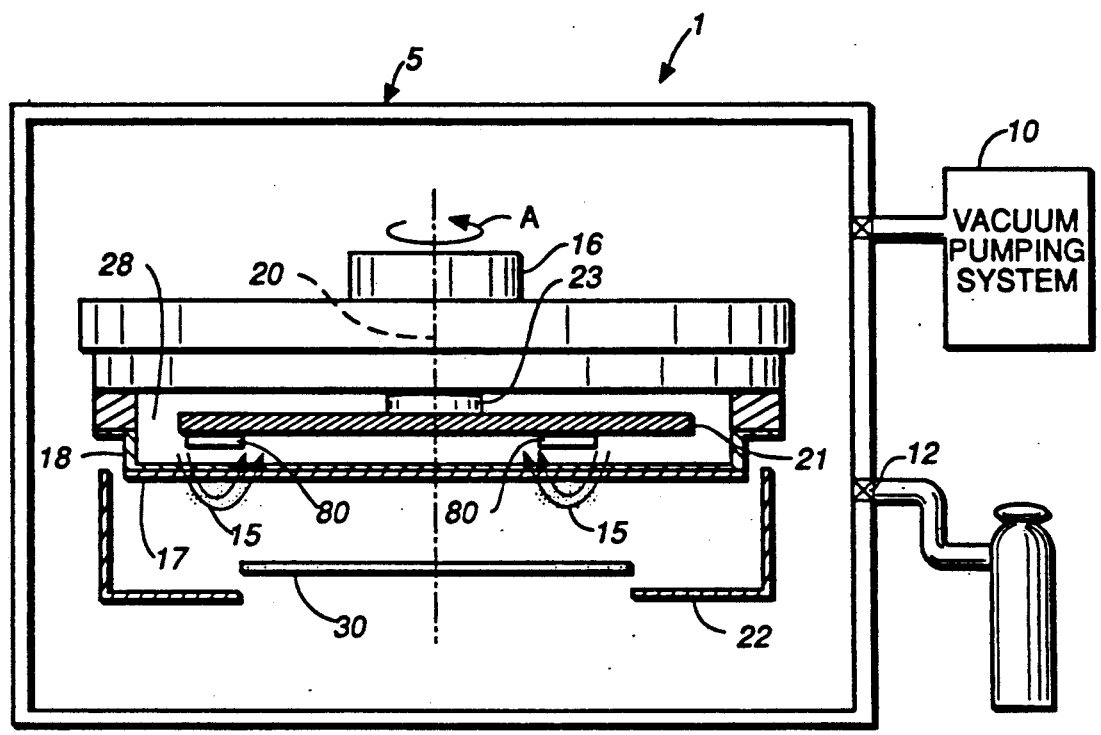
FIG._1
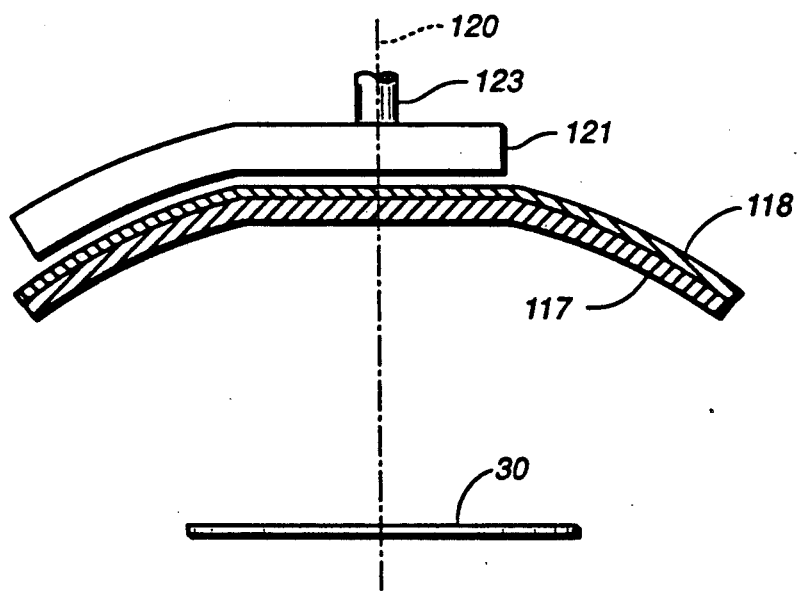
FIG._7

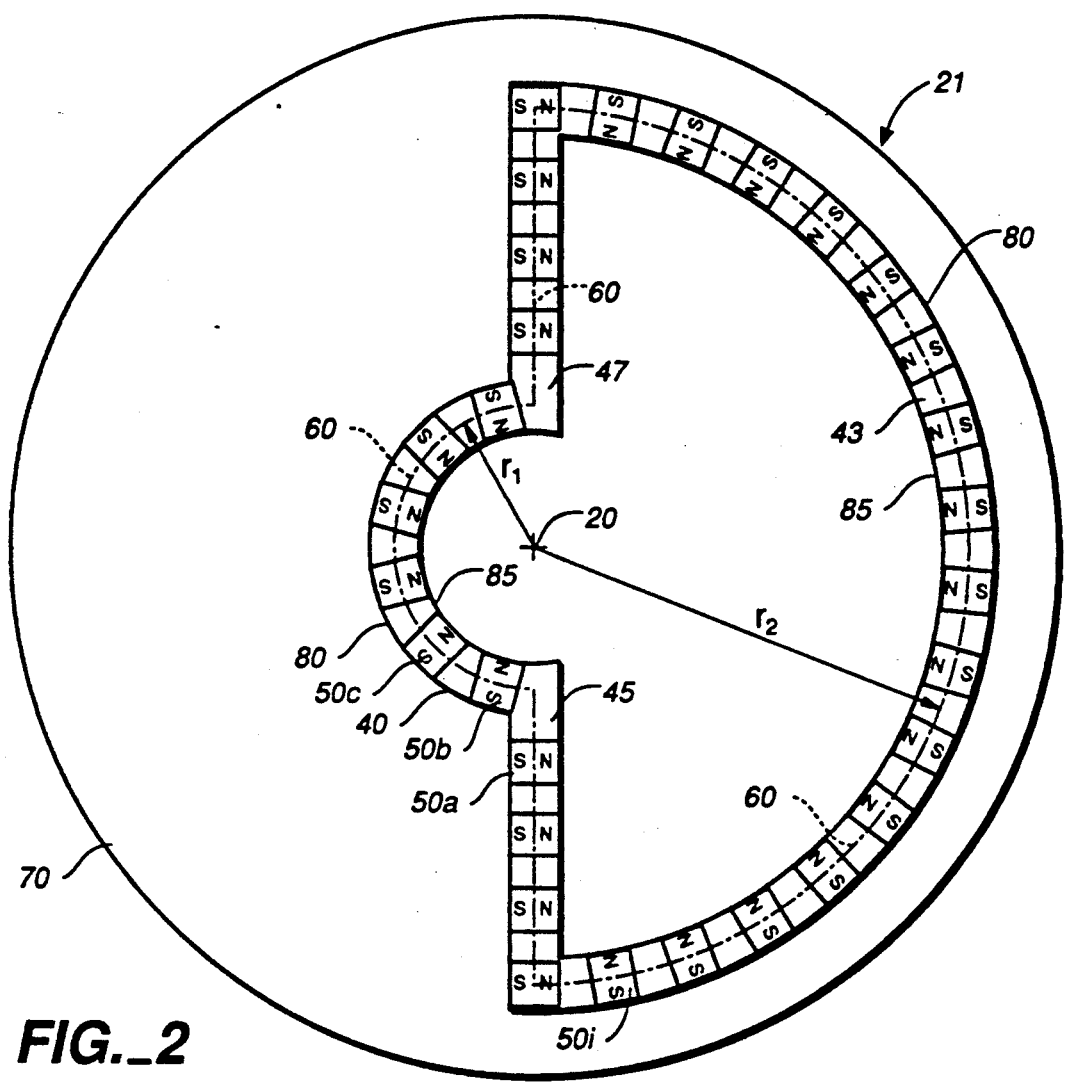
FIG._2
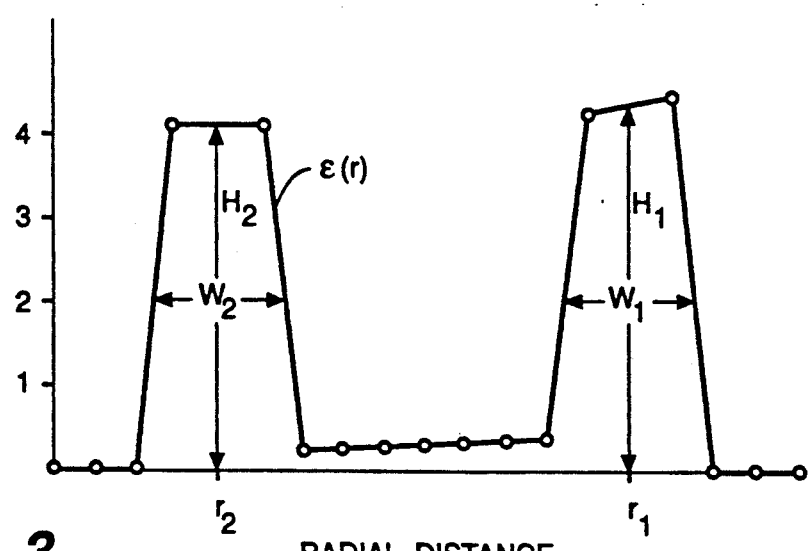
FIG._3 RADIAL DISTANCE

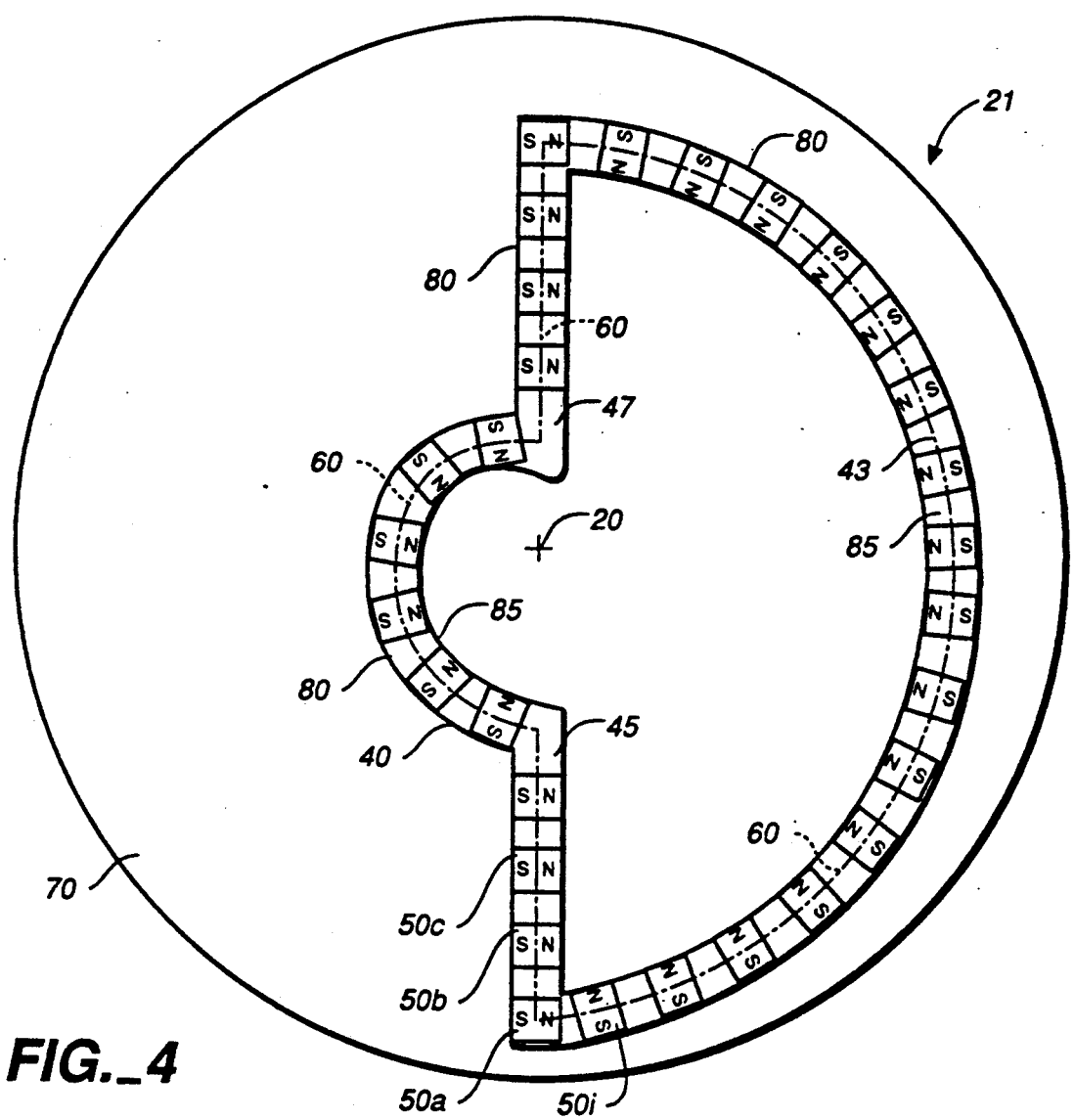
FIG._4
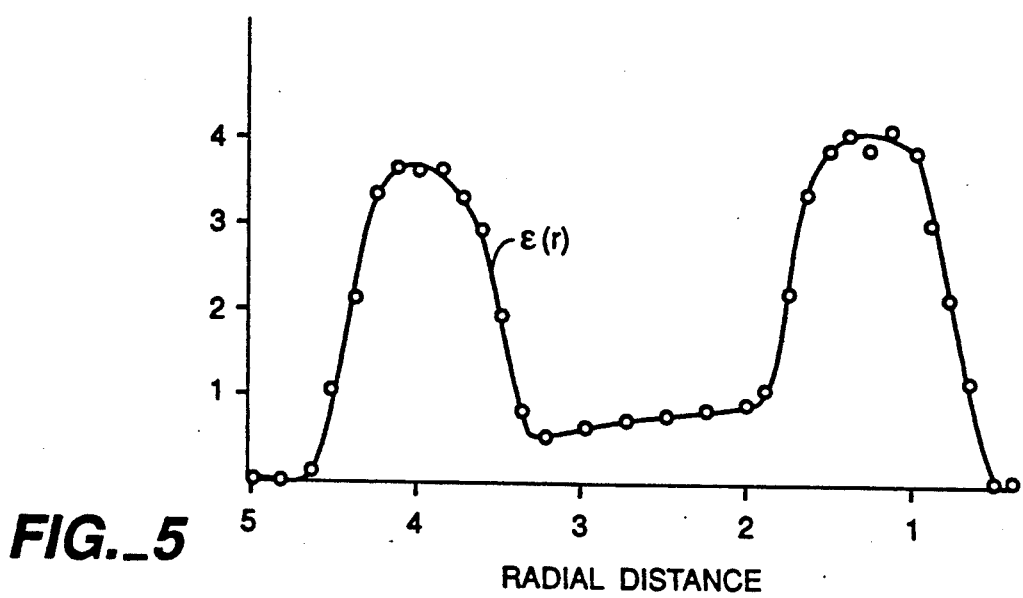
FIG._5  RADIAL DISTANCE

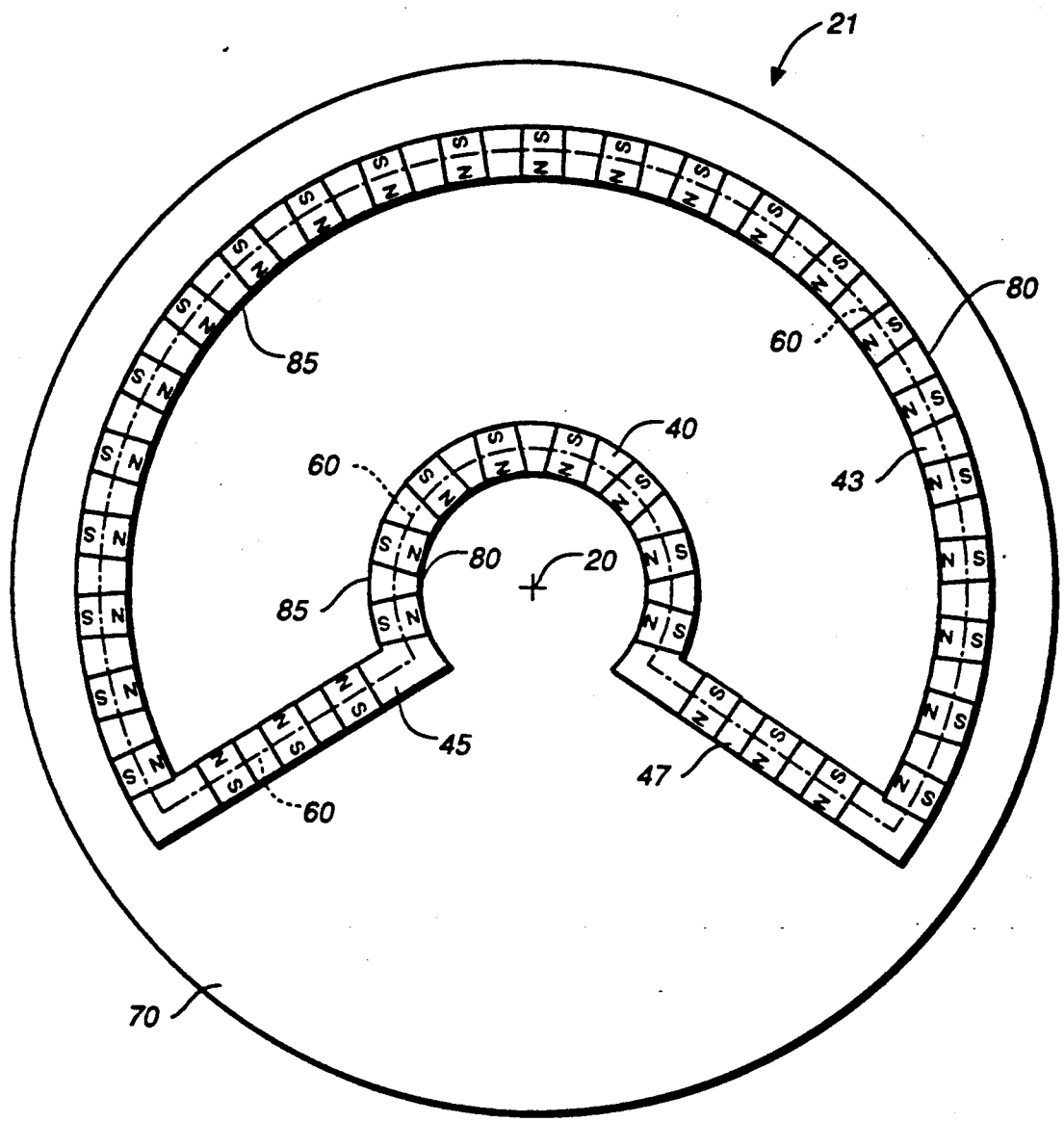
FIG._6

APPARATUS AND METHOD FOR MULTIPLE RING SPUTTERING FROM A SINGLE TARGET

This invention relates to the field of thin film deposition and, in particular, to sputtering apparatus for physical vapor deposition.

BACKGROUND OF THE INVENTION

Physical vapor deposition by sputtering is a well known process that has found widespread application in the fabrication of very large scale integrated (VLSI) semiconductor devices. In magnetron sputtering a plasma is formed in a low pressure inert gas. The plasma is confined to a region near a sputter target, which is made of the material to be sputtered and which usually serves as the cathode of the system. A magnetic field, typically having field lines which loop through the sputter target surface, restricts the trajectories of the electrons in the plasma, thereby intensifying and confining the plasma. Ions in the plasma bombard the sputter target dislodging atoms of the target material which are then deposited on a substrate.

A large number of VLSI devices are typically fabricated on a thin, generally circular silicon substrate referred to as a wafer. VLSI device fabrication involves a large number of processing steps, with sputtering being used to provide metallization layers and interconnects between device layers. Most commonly, sputtered aluminum is the material used for these purposes.

In recent years wafer sizes have continually increased, and now the use of eight-inch diameter wafers is common in the industry. Large wafer sizes permit a larger number devices to be grown on a single substrate. However, larger wafer sizes impose greater demands on sputtering systems. For example, one requirement of a sputtering system used in semiconductor processing is that it deposit a layer of uniform thickness over the entire wafer surface. (Hereinafter the term uniformity will be used in connection with the thickness of the deposited film unless the context suggests otherwise.) Lack of uniformity may result in lowered device yield (i.e., the percentage of devices which meet operating specifications) and/or variations in device performance. Larger wafer sizes make it more difficult to achieve very demanding levels of uniformity.

One approach to improving the uniformity of a sputtering system is to sputter from two concentric targets. For an example of this approach see U.S. Pat. No. 4,606,806 which describes a sputtering source sold by the assignee of the present invention under the trademark ConMag® II. In the ConMag® II sputtering source each of the sputter targets has a unique shape and its own separate power supply enabling separate control over the sputtering rate from each target. In addition to providing good uniformity, this configuration provides good step coverage, i.e., the ability to uniformly cover vertical "steps" and other angled surfaces on the wafer.

A number of commercially available sputtering sources use a planar sputtering target. One such source, commercially available from the assignee of the present invention under the trademark VersaMag#, relies on a rotating magnet mounted behind the target for moving the plasma over the face of the target. Rotation of the plasma was introduced for the purposes of improving uniformity and step coverage, as well as improving the uniformity of target erosion so that targets are more efficiently utilized.

In the recently issued U.S. Pat. No. 4,995,958, entitled *Sputtering Apparatus With A Rotating Magnet Array Having A geometry For Specified Target Erosion Profile*, which is also assigned to the assignee of the present invention, it was shown how to construct a closed-loop rotating magnet, for use with a planar sputtering source, which enables one to realize a predetermined erosion profile to thereby achieve, for example, highly efficient target material utilization and high deposition rates. The invention of the '958 patent is readily adapted to use in a VersaMag# sputtering source.

A closed-loop magnet configuration of the type described in the '958 patent has the additional advantage of being easily adjustable so that the shape of the magnet array, and therefore the characteristics of the sputtering source, can be changed without great difficulty or expense. As described in that patent, the disclosure of which is incorporated by reference, a plurality of magnets are held in position by two iron keepers which define the shape of the closed loop. Replacement and/or adjustment of the iron keepers to provide a different closed-loop configuration is a relatively simple matter. In this manner it is possible to use one source for different purposes.

As noted, the original objective of the closed-loop rotating magnet of the '958 patent was to achieve better target utilization efficiency, normally an important objective given the high cost of sputter targets, and to achieve high deposition rates, another important factor due to the demand for ever greater system "throughput". In some instances, the need for greater uniformity might outweigh the desire for efficient target utilization and deposition rate. In such a case the high levels of uniformity achieved by multiple sputtering rings remain attractive.

In this context the ability to provide a multiple ring sputtering source which is adaptable to other uses, and without the need to design an entirely new source is especially desirable.

Accordingly, it is an object of the present invention to provide a multiple ring sputtering source capable of highly uniform deposition.

Another object of the present invention is to adapt existing rotating magnet technology to provide a multiple ring sputtering source.

SUMMARY OF THE INVENTION

These and other objects that will be apparent to those skilled in the art are realized in the present invention comprising a magnetron sputtering apparatus for thin film deposition having a target cathode from which sputtering occurs, and a closed-loop rotating magnet adjacent to the back surface of the target cathode, the closed-loop rotating magnet being configured such that sputtering from the target occurs primarily from a plurality of concentric areas of the target. In a further refinement of the present invention, the closed-loop magnet is configured to provide a predetermined erosion profile in each of the concentric areas from which sputtering occurs. In the preferred embodiment, the closed-loop magnet comprises a plurality of curved sections, each having a different average radius, interconnected by an equal number of radial sections. The relative lengths of the curved sections can be adjusted to determine the relative amount of sputtering from each concentric ring.

BRIEF DESCRIPTION OF THE DRAWINGS

FIG. 1 is a simplified elevational view, in partial cross section, showing a sputtering system of the present invention.

FIG. 2 is a plan view of a closed-loop magnet configuration in accordance with one embodiment of the present invention.

FIG. 3 is a cross-sectional view of a calculated target erosion profile caused by the closed-loop magnet of FIG. 2.

FIG. 4 is a plan view of a closed-loop magnet configuration in accordance with another embodiment of the present invention.

FIG. 5 is a cross-sectional view of a calculated target erosion profile caused by the closed-loop magnet of FIG. 4.

FIG. 6 is a simplified plan view of a closed-loop magnet configuration in accordance with another embodiment of the present invention.

FIG. 7 is a simplified partial cross-sectional view of a sputtering system in accordance with another embodiment of the present invention.

DETAILED DESCRIPTION

FIG. 1 shows an overall elevational view, in partial cross-section, of a sputtering system 1 in accordance with the present invention. Generally, the system shown in FIG. 1 includes a simplified view of the sputtering source sold commercially under the VersaMag trademark, but modified in accordance with the present invention.

Sputtering system 1 is housed in a vacuum chamber 5, which may be evacuated by vacuum pumping means 10, shown schematically. A suitable vacuum pumping means may comprise a mechanical roughing pump and a ultra-clean high vacuum pump such as a cryopump. Construction of a suitable vacuum chamber 5 and connection of vacuum pumping means 10 is well known in the art and will not be described further.

After vacuum chamber 5 is pumped down to a sufficiently low pressure, which may be, for example, $10^{-5}$ torr or less, a small quantity of inert gas such as argon is introduced into chamber 5 via ga supply inlet 12 raising the pressure in the chamber to 1-5 millitorr, for example. A plasma discharge 15 is then created, in a known manner, by applying a high negative voltage on target cathode 17. Plasma shield 22, held at ground potential, also serves as the anode for the device. The plasma discharge is located adjacent the target cathode and is shaped and confined by closed-loop magnet 21 positioned adjacent to and behind target cathode 17. Detailed embodiments of closed-loop magnet array 17 are shown in FIGS. 2 and 4, and are described in greater detail below. Plasma shield 22 also serves the purpose of preventing the plasma from contacting wafer 30 or from causing sputtering from other surfaces in the vacuum chamber. The surface of target cathode 17 is made of the material to be sputtered, most commonly an alloy comprising aluminum. Closed-loop magnet 21 is rotated at a constant angular velocity about the central axis 20 of the target cathode 17 by drive means, which may comprise, for example, a motor 16 with appropriate gearing, and a drive shaft 23. Plasma discharge 15, which is confined by the magnetic field lines of magnet 21, rotates with the magnet.

Target cathode 17 is consumed in the sputtering process and is, therefore, removably attached to a backing plate 18. In the preferred embodiment target cathode 17 is bonded to backing plate 18. Bonding assures good heat transfer from the target cathode to the backing plate, thereby allowing good temperature control of the target cathode 17, which is subject to a high thermal input in the course of the sputtering process. Temperature control may be further enhanced by circulating cooling water in water-tight chamber 28. While sputtering system 1 of FIG. 1 is shown with the target pointed downward toward an upward facing wafer 30, the opposite configuration may also be used, i.e., with the target pointed upward toward a downward facing wafer.

Plasma discharge 15 comprises a high density of positive argon ions which are attracted to and strike the surface of target cathode 17 knocking loose neutral atoms of the target material. Some of the atoms knocked loose in this manner are incident on the top surface of wafer 30 and are deposited thereon. Due to randomness in the angles at which atoms are ejected from the target, and gas scattering effects as the ejected atoms travel in vacuum chamber 5, the atoms reaching the substrate are incident at a variety of angles. It is well known that the angles of the sputtered atoms generally conform to cosine distribution.

Assuming, for the moment, that sputtering is from a planar target roughly equal in size to a planar substrate, that the substrate and the target are closely spaced, and that the rate of sputtering is the same over the entire area of the entire surface of the target cathode, it can be shown that material will deposit faster near the center of the wafer than near the periphery, i.e., deposition will not be uniform. One solution to this is to use a target having a much larger surface area than the wafer or to increase the distance between the target and the wafer, but these approaches are inefficient, particularly as wafer sizes grow larger. Another approach is to use a target with a non-planar face such as that shown in U.S. Pat. No. 4,457,825, sold commercially by the assignee of the present invention under the trademark ConMag®I. In the source of the '825 patent the target surface is initially in the shape of a section of a cone. The ConMag®II source, described above, utilizes two, concentric, ring-shaped sputter targets. This has been found to further enhance uniformity and step coverage.

These commercially available sources, and most others known to the inventor, have fixed designs which prevent them from being adapted to address evolving new requirements such as larger wafer size, higher uniformity specifications, improved efficiency of material usage or the like. As noted above, the closed-loop magnet configuration disclosed in the '958 patent is readily adaptable to meet such evolving needs. New closed-loop configurations may be developed and implemented without the need to substantially redesign the sputtering source.

FIG. 2 is a plan view of an embodiment of a closed-loop planar magnet array 21 in accordance with the present invention. Magnet array 21 is rotated about axis 20 by the drive means described above in reference to FIG. 1, and consists of two semicircular portions 40 and 43 interconnected by two radial portions 45 and 47. Semicircular magnet array portion 40 has a first radius which is smaller than the radius of semicircular magnet array portion 43.

Magnet array 21 includes a plurality of substantially identical permanent magnets 50 $a, b, \ldots, i$, each of which is disposed with its center on centerline 60, and each having its North magnetic pole on the inward side of centerline 60. Obviously, it is equivalent to have the South magnetic pole on the inward side of centerline 60; the important feature being that each magnet has the same orientation relative to the centerline. Magnets $50a, b, \ldots, i$ are held in place by circular plate 70 and thin (1/16") iron keepers 80 and 85. In the preferred embodiment, square (0.75"×0.75") samarium cobalt magnets are used because of their high strength/weight ratio. The magnets are equally spaced around the loop. In a preferred embodiment the spacing between the magnets is approximately 0.3".

A rotational speed of 57 rpm, the normal speed of a VersaMag ™ source, has been found to be satisfactory to produce good erosion averaging without being too fast to cause creation of undesired eddy currents.

An estimated erosion profile of the target surface caused by rotation of the magnet array of FIG. 2 is shown in FIG. 3. It is seen that there are two distinct areas on the surface of the target from which nearly all the sputtering occurs, and that the sputtering rate from the two areas is substantially the same. In effect, although a planar target is being used, almost all the sputtering is from two concentric rings on the surface of the target overlying the semicircular portions 40 and 43 of closed-loop magnet array 21. For simplicity the erosion profile is shown as being highly angular; however, in practice when using semicircular curved magnet portions, the erosion pattern of each target ring is more nearly Gaussian in shape. In this embodiment the width of the rings is limited by the width of the magnets which are used in the magnet array.

The amount of erosion between the two rings is less than 10% of the erosion in the ring areas and can be ignored. Target erosion between the rings is caused by the plasma associated with radial portions 45 and 47. It is necessary to maintain a closed-loop configuration in order to sustain a rotating plasma, and, therefore, it is necessary to magnetically interconnect portions 45 and 47. However, in order to minimize the effects of the interconnecting portions they should be as short as possible, which is achieved by having them lie radially.

A preferred embodiment of the present invention is shown in FIG. 4, wherein similar parts are similarly numbered. In this embodiment curved sections 40 and 43 are not arcs of a circle, but rather have a curvature calculated to result in a predetermined erosion profile of the target. Such a curvature may be obtained, for example, by following the teaching of the aforementioned '958 patent. In this embodiment the width of each of the rings can be established without regard to the width of the magnets. Moreover, the erosion profile of each ring can be a predetermined shape rather than simply Gaussian. It will be noted that inner curved portion 40 has an average radius which is smaller than the average radius of outer curved portion 43. Moreover, the maximum radius of inner curved portion 40 is smaller than the minimum radius of outer curved portion 43.

FIG. 5 shows an erosion profile obtained using the embodiment of FIG. 4. Again, the width of the sputtering ring on the target surface can be arbitrarily determined using the teaching of the '958 patent. For example, it is not necessary for the two rings to be equally wide or otherwise similar.

While the embodiments of FIGS. 2 and 4 show closed-loop magnet arrays having two curved portions subtending an equal angle about axis 20, in the general case there can be more than two curved portions and the curved portions need not subtend equal angles. As wafer size grows, and with it target size, it may be desirable to use a target having more than two rings. By following the teaching of the present invention, there can be multiple curved portions defining multiple concentric rings, it being understood that each curved portion defining a different sputtering ring will have a different average radius. If each of the curved portions subtends an equal angle, the amount of sputtering from each corresponding ring on the target surface will be approximately equal. By adjusting the relative angular extent of the curved portions it is possible to thereby adjust the relative amount of sputtering from each of the rings. Thus, for example, in a modification of the embodiment of FIG. 4, if inner curved portion 40 were made to subtend an arc of 120° and outer curved portion 43 to subtend an arc of 240°, the relative amount of sputtering from the inner and outer rings would be approximately 1:2.

FIG. 6 shows another embodiment of the present invention similar in all respects to the embodiment of FIG. 2 except that inner and outer curved portions 40 and 43, respectively, are parallel rather than opposing. In this embodiment the curved portions can be equal in length and greater (or less) than 180°, as desired. While the embodiment of FIG. 6 is shown with the curved portions being arcs of a circle, more complex shapes, such as those described in connection with FIG. 4, may be utilized. Moreover, in accordance with the present invention a multiple ring closed-loop magnet can be constructed having both opposing and parallel curved portions.

While the embodiments of FIGS. 2, 4 and 6 are shown in the context of planar targets, the present invention is readily adaptable to configurations wherein the target has a non-planar surface. FIG. 7 is a simplified partial cross-sectional view of a sputter source of the present invention having a non-planar target 117 and a conforming closed-loop magnet array 121. Magnet array 121 is rotated by drive means (not shown) coupled to drive shaft 123. Sputter target 117 is mounted on backing plate 118. Material sputtered from the surface of target 117 is deposited on wafer 30 as described in reference to the FIG. 1 embodiment. Well-known features of sputtering systems, such as gas supplies, vacuum pumps, plasma shields and the like, are omitted in the interest of clarity. In this embodiment the rings can be individually directed much like the rings of a ConMag® II sputter source.

In U.S. patent application Ser. No. 471,898, a continuation-in-part of the aforementioned '958 patent, which is also incorporated by reference, the teachings of the '958 patent are extended to non-planar target surfaces. Thus it is possible to obtain the benefits of a predetermined erosion profile in the context of the present invention when using a non-planar target.

Although the present invention has been described in detail with reference to the embodiments shown in the drawings, it is not intended that the invention be restricted to such embodiments. It will be apparent to those skilled in the art that various departures from the foregoing description and drawings may be made without departing from the scope or spirit of the invention. Therefore it is intended that the invention be limited only by the following claims.

I claim:

1. A magnetron sputtering apparatus for depositing a material on a substrate, comprising:

a target cathode having a front surface generally facing said substrate and comprising said material to be deposited; and, rotatable magnet means adjacent to said target cathode and generally behind said front surface, said rotatable magnet means being configured such that sputtering from said target occurs primarily in a plurality of distinct concentric areas of said front surface, said concentric areas being separated by regions in which there is no substantial erosion of the target cathode.

2. The magnetron sputtering apparatus of claim 1 wherein said target cathode front surface is planar prior to erosion thereof.

3. The magnetron sputtering apparatus of claim 1 wherein said target cathode front surface is non-planar prior to erosion thereof.

4. The magnetron sputtering apparatus of claim 1 wherein the axis of rotation of said rotating magnet means is substantially at the center of said front surface.

5. The magnetron sputtering apparatus of claim 1 wherein said rotatable magnet means includes a plurality of magnets disposed in a predetermined closed loop.

6. The magnetron sputtering apparatus of claim 5 wherein said closed loop comprises a plurality of curved portions each having a different average radius, and further comprising substantially linear portions connecting said curved portions.

7. The magnetron sputtering apparatus of claim 6 wherein the number of curved portions and the number of substantially linear portions is two.

8. The magnetron sputtering apparatus of claim 6 wherein the angle subtended by each of said curved portions is equal.

9. The magnetron sputtering-apparatus of claim 6 wherein each of said curved portions forms an arc of a circle.

10. The magnetron sputtering apparatus of claim 6 wherein each of said curved portions has a curvature calculated to produce a predetermined erosion profile in said target cathode.

11. The magnetron sputtering apparatus of claim 6 wherein said substantially linear portions extend radially from the axis of rotation of said rotatable magnet means.

12. A magnetron sputtering apparatus for depositing a material on a substrate, comprising:

a vacuum chamber;

vacuum pump means for evacuating said vacuum chamber;

gas supply and control means for introducing a substantially subatmospheric pressure of an inert gas into said evacuated vacuum chamber for forming a plasma discharge;

a cathode having a target surface comprising said material to be deposited and a back surface generally opposite said target surface;

closed-loop magnet means adjacent said back surface; and, drive means for rotating said closed-loop magnet means about an axis which passes through the approximate center of said target surface;

wherein said closed-loop magnet means is configured such that sputtering from and erosion of said target surface occurs primarily in a plurality of distinct concentric areas of said target surface, said concentric areas being separated by regions in which there is no substantial erosion of the target cathode.

13. The apparatus of claim 12 wherein the number of concentric areas is two.

14. The apparatus of claim 12 wherein said closed-loop magnet means comprises a plurality of permanent magnets disposed to form said closed loop.

15. The apparatus of claim 12 wherein said closed loop comprises at least two curved portions, each curved portion lying generally under one of said concentric areas.

16. The apparatus of claim 15 wherein said at least one of said curved portions is shaped to result in a predetermined erosion profile of the target surface.

17. A method of depositing a uniform layer of material, comprising:

placing a substrate in a magnetron sputtering apparatus facing a sputter target surface;

creating a plasma discharge adjacent to said sputter target surface;

sputtering from a plurality of distinct concentric areas of said sputter target surface by rotating a closed-loop magnet behind said sputter target surface, said concentric areas being separated by regions in which there is no substantial erosion of the target surface.

* * * * *